United States Patent
Dykaar

(10) Patent No.: US 11,711,898 B2
(45) Date of Patent: Jul. 25, 2023

(54) METHODS AND SYSTEMS FOR ALIGNING A COMPONENT

(71) Applicant: GOOGLE LLC, Mountain View, CA (US)

(72) Inventor: Douglas Raymond Dykaar, Waterloo (CA)

(73) Assignee: GOOGLE LLC, Mountain View, CA (US)

( * ) Notice: Subject to any disclaimer, the term of this patent is extended or adjusted under 35 U.S.C. 154(b) by 352 days.

(21) Appl. No.: 16/782,230

(22) Filed: Feb. 5, 2020

(65) Prior Publication Data
US 2020/0288581 A1    Sep. 10, 2020

Related U.S. Application Data

(60) Provisional application No. 62/814,565, filed on Mar. 6, 2019.

(51) Int. Cl.
| | |
|---|---|
| *H05K 3/46* | (2006.01) |
| *H05K 3/00* | (2006.01) |
| *B23K 3/08* | (2006.01) |
| *H05K 13/04* | (2006.01) |
| *B23K 101/42* | (2006.01) |

(52) U.S. Cl.
CPC ......... *H05K 3/4638* (2013.01); *H05K 3/0008* (2013.01); *B23K 3/087* (2013.01); *B23K 2101/42* (2018.08); *H05K 13/0465* (2013.01)

(58) Field of Classification Search
CPC ............... H05K 3/4638; H05K 3/0008; H05K 13/0465; B23K 2101/42; B23K 3/087
USPC ......... 29/729, 700, 739, 740, 832, 825, 829, 29/592.1
See application file for complete search history.

(56) References Cited

U.S. PATENT DOCUMENTS

| | | | |
|---|---|---|---|
| 2003/0048625 A1* | 3/2003 | Ishii | H05K 13/0053 361/818 |
| 2011/0016708 A1* | 1/2011 | Yang | H05K 3/303 29/729 |
| 2013/0201465 A1* | 8/2013 | Wang | H01L 24/97 355/72 |

\* cited by examiner

*Primary Examiner* — Peter Dungba Vo
*Assistant Examiner* — Azm A Parvez

(57) ABSTRACT

There is provided a method which includes placing a component on a substrate and extending an alignment member through an opening in the substrate. Once the alignment member is extended through the opening, the component is moved to abut against the alignment member to align the component relative to the substrate. After the component is aligned relative to the substrate, the component is secured to the substrate and the alignment member is retracted through the opening.

16 Claims, 18 Drawing Sheets

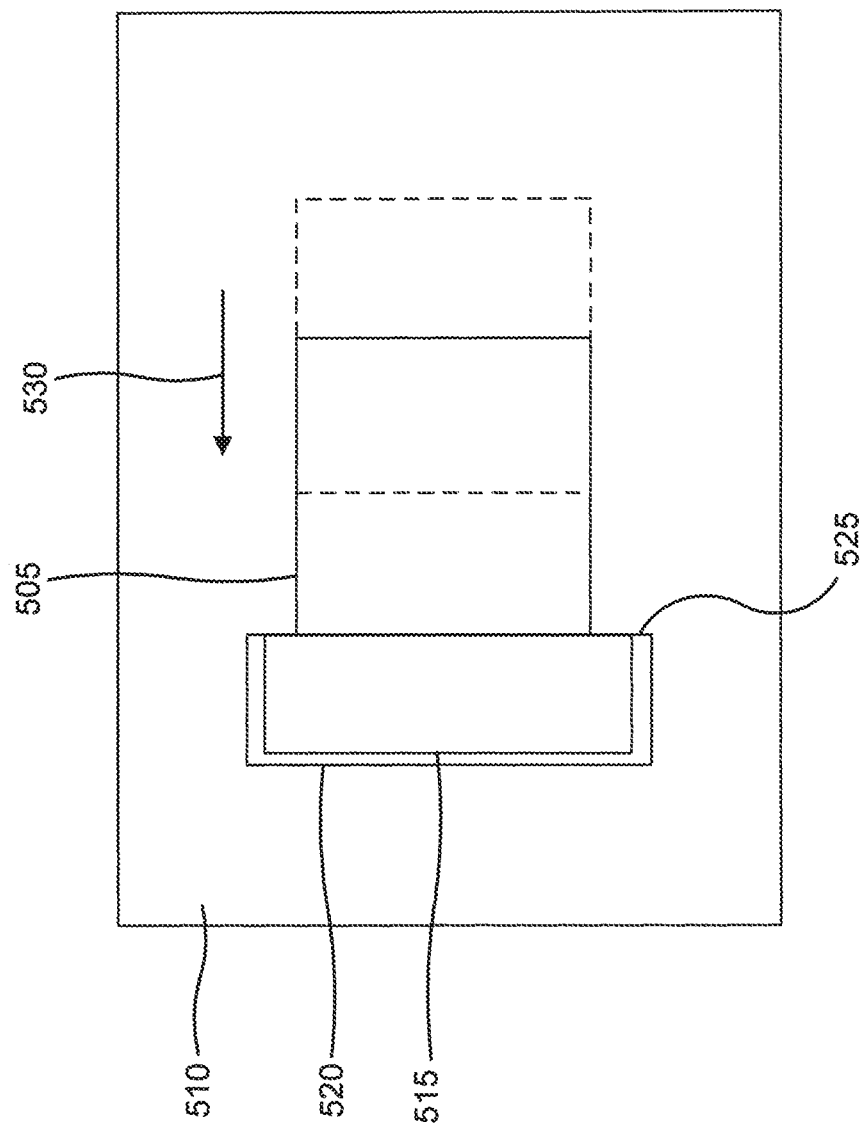

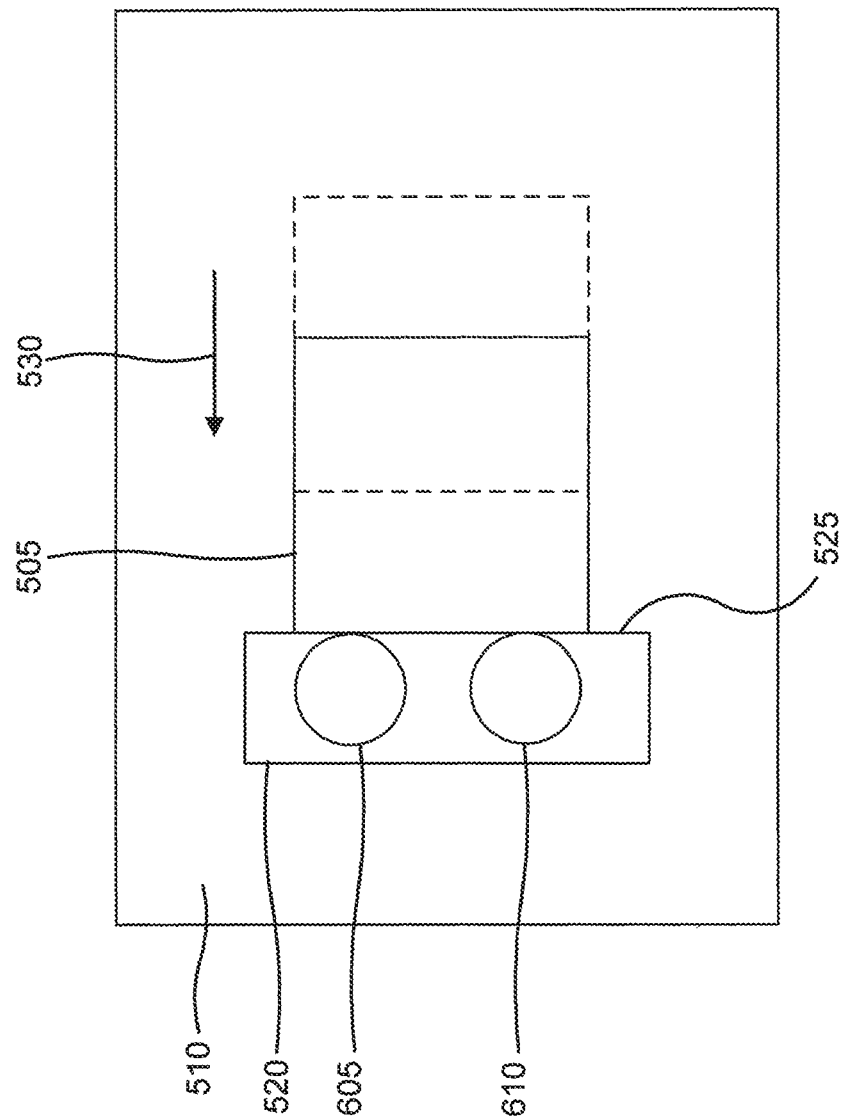

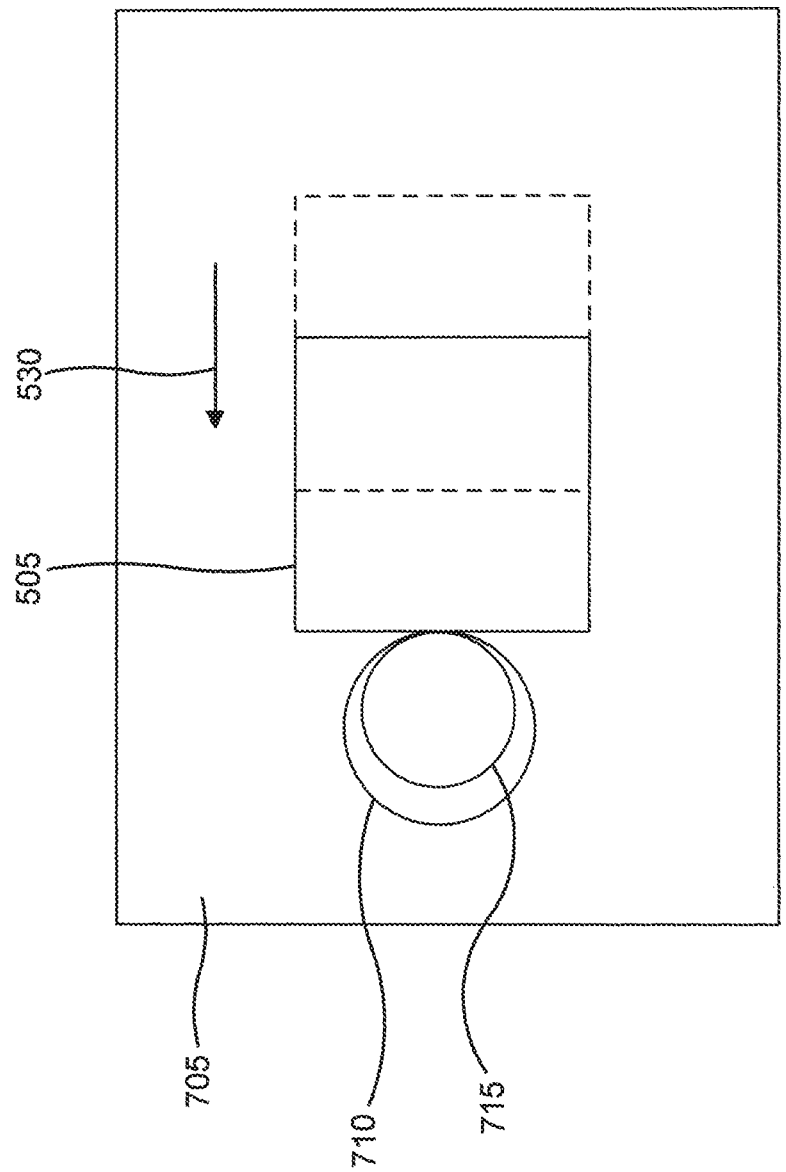

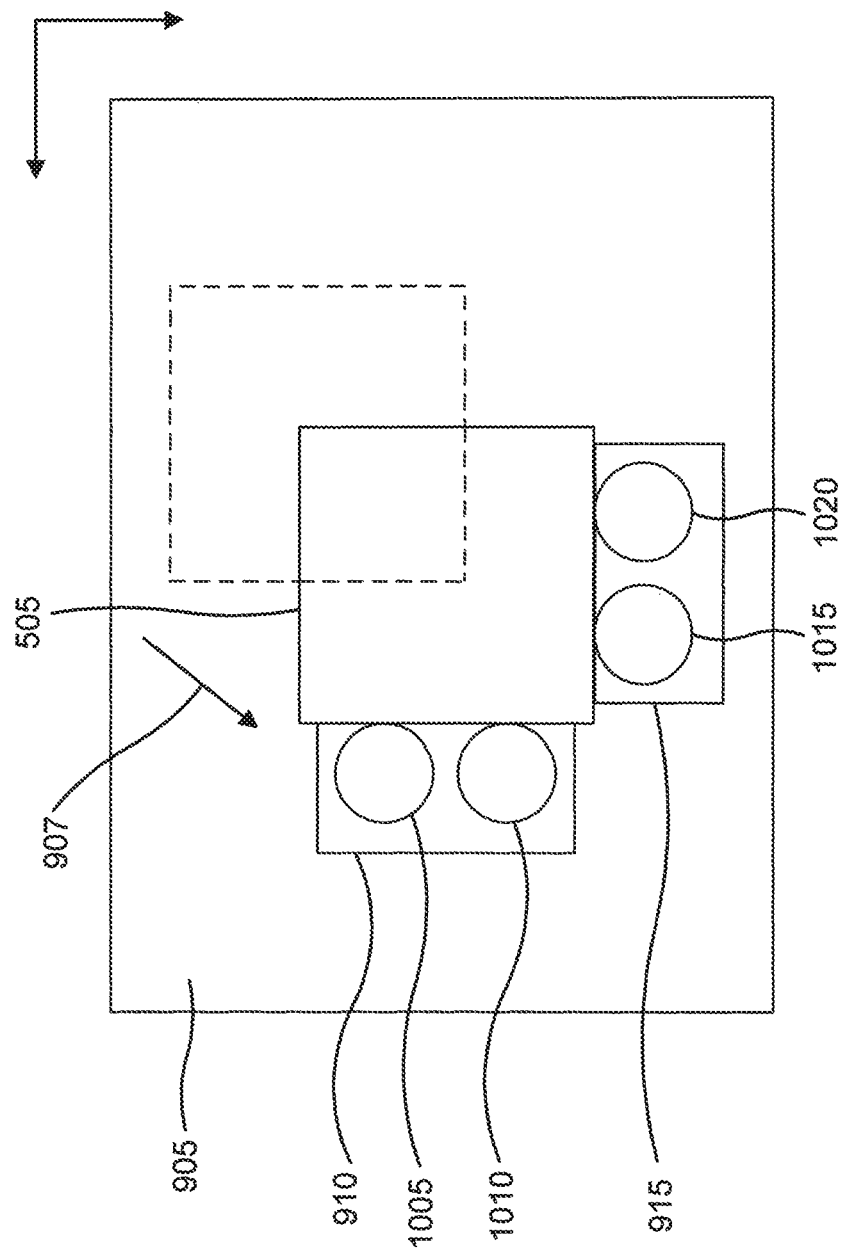

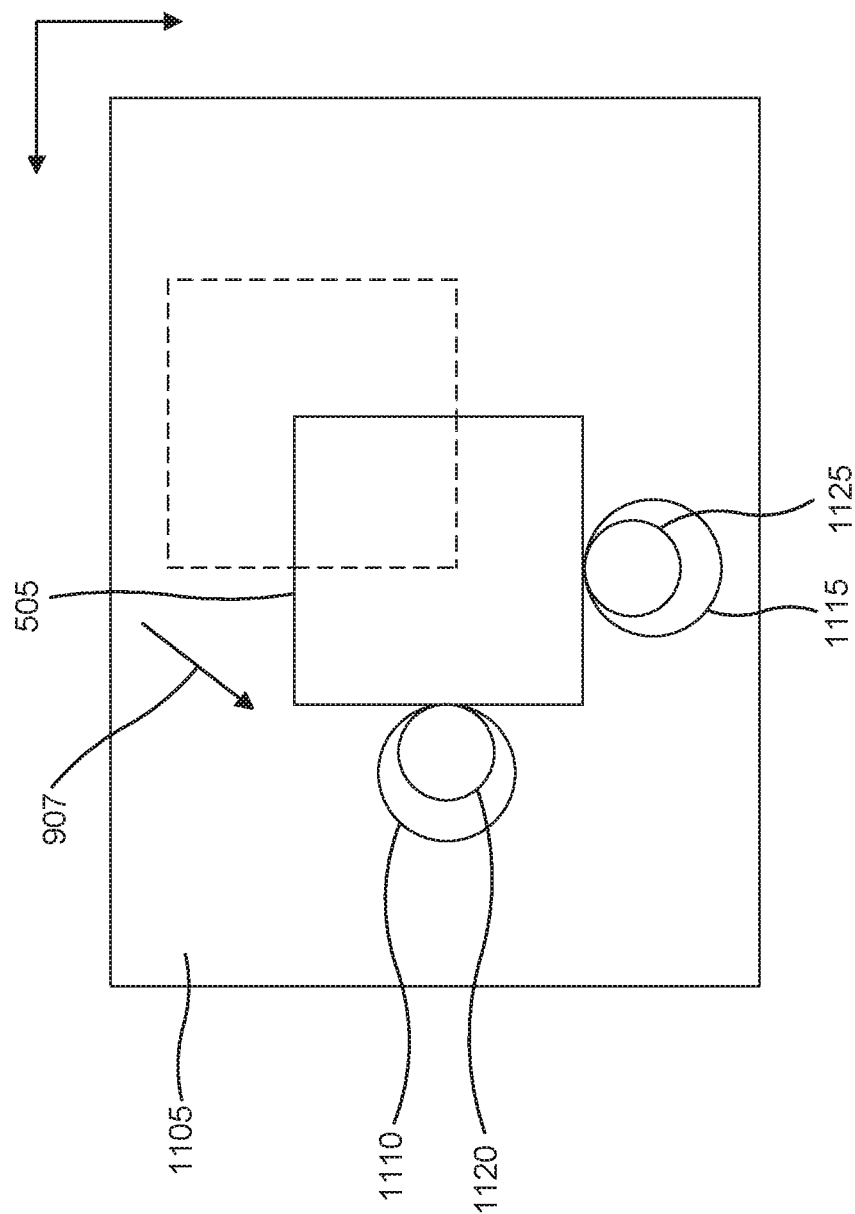

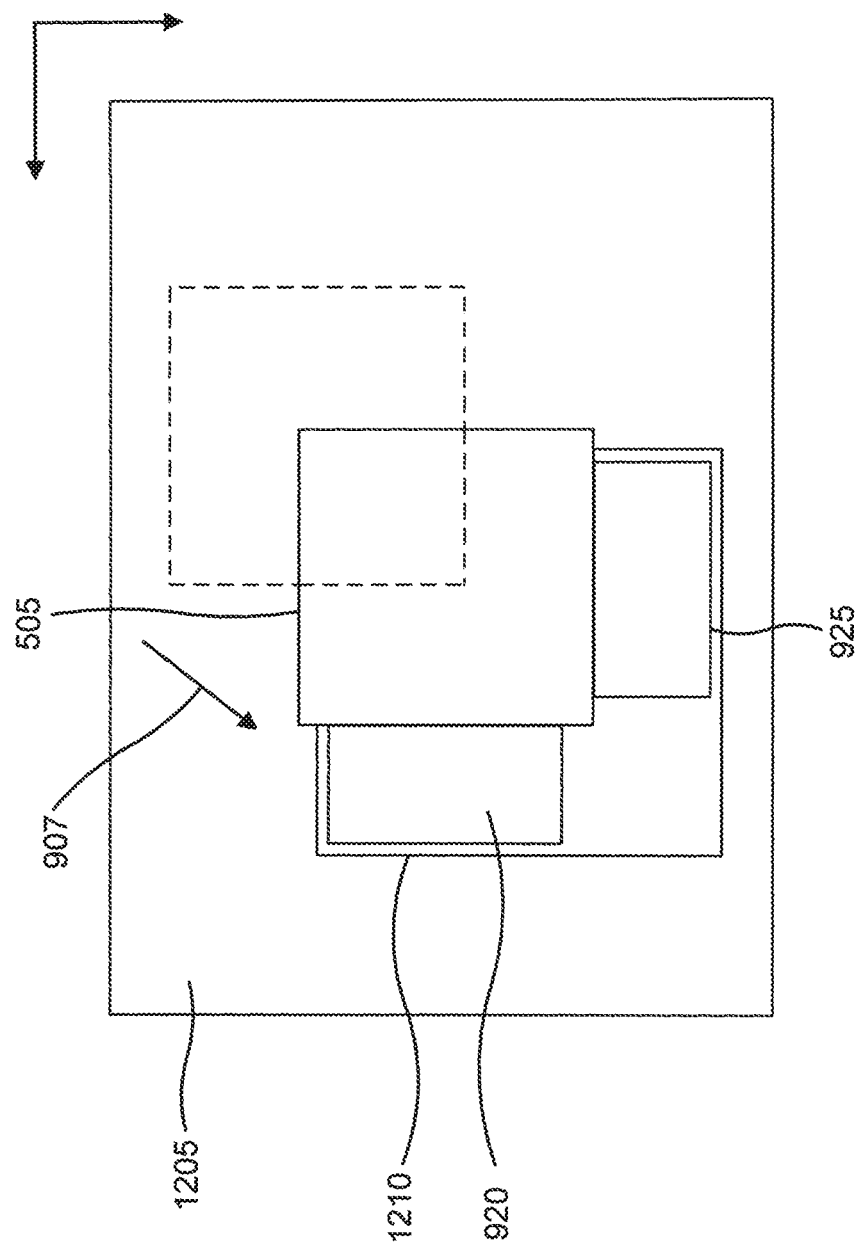

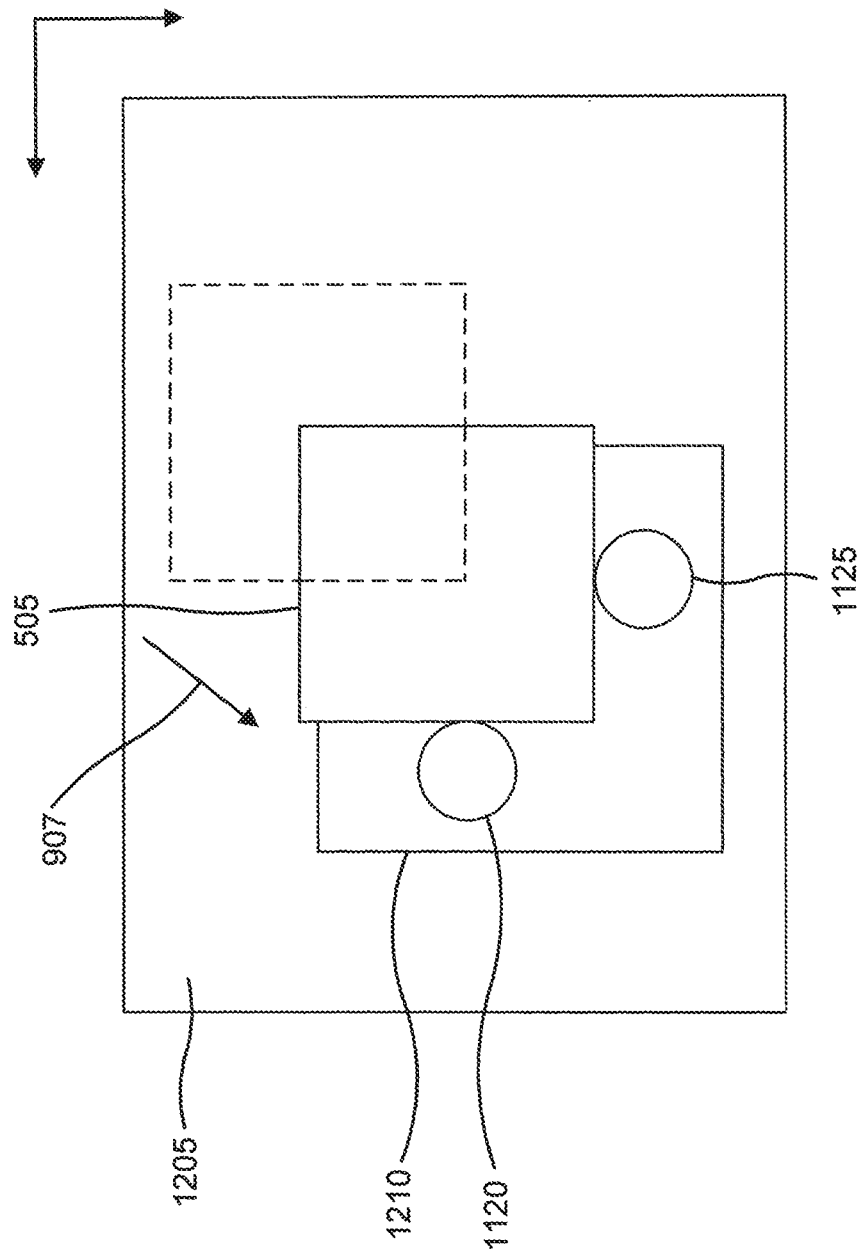

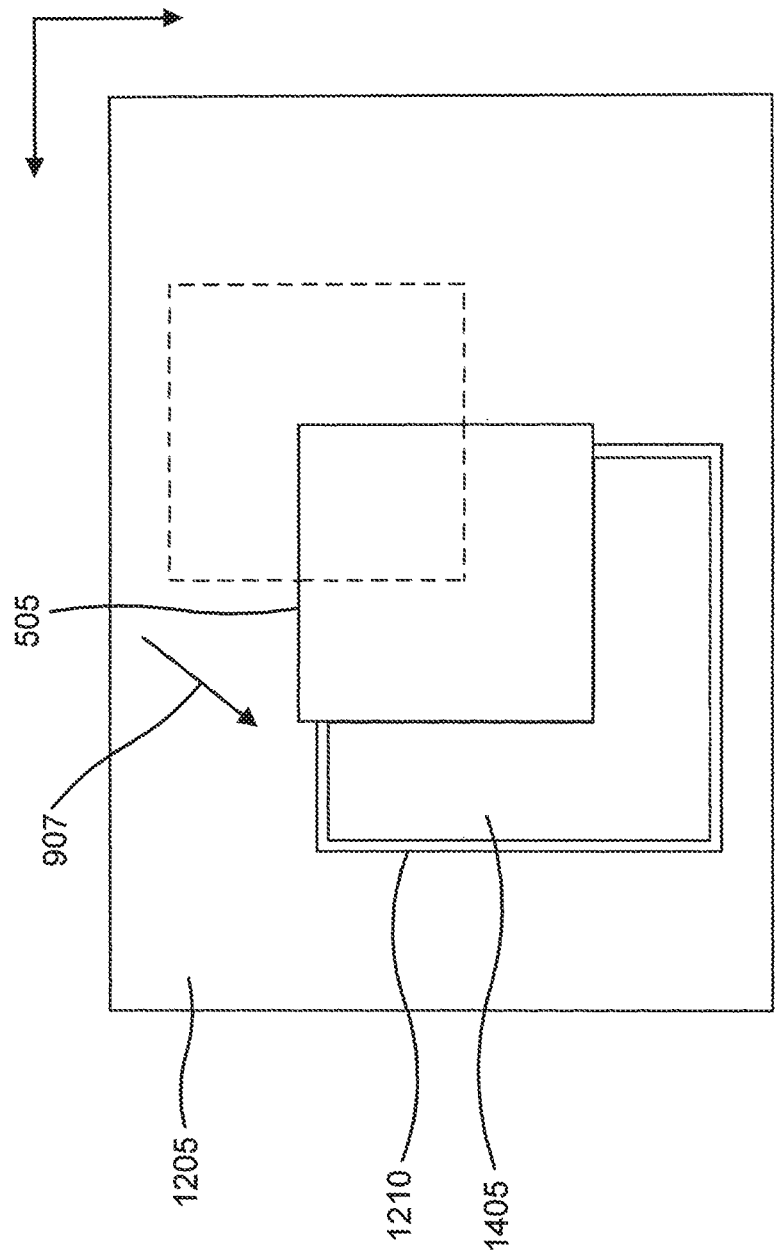

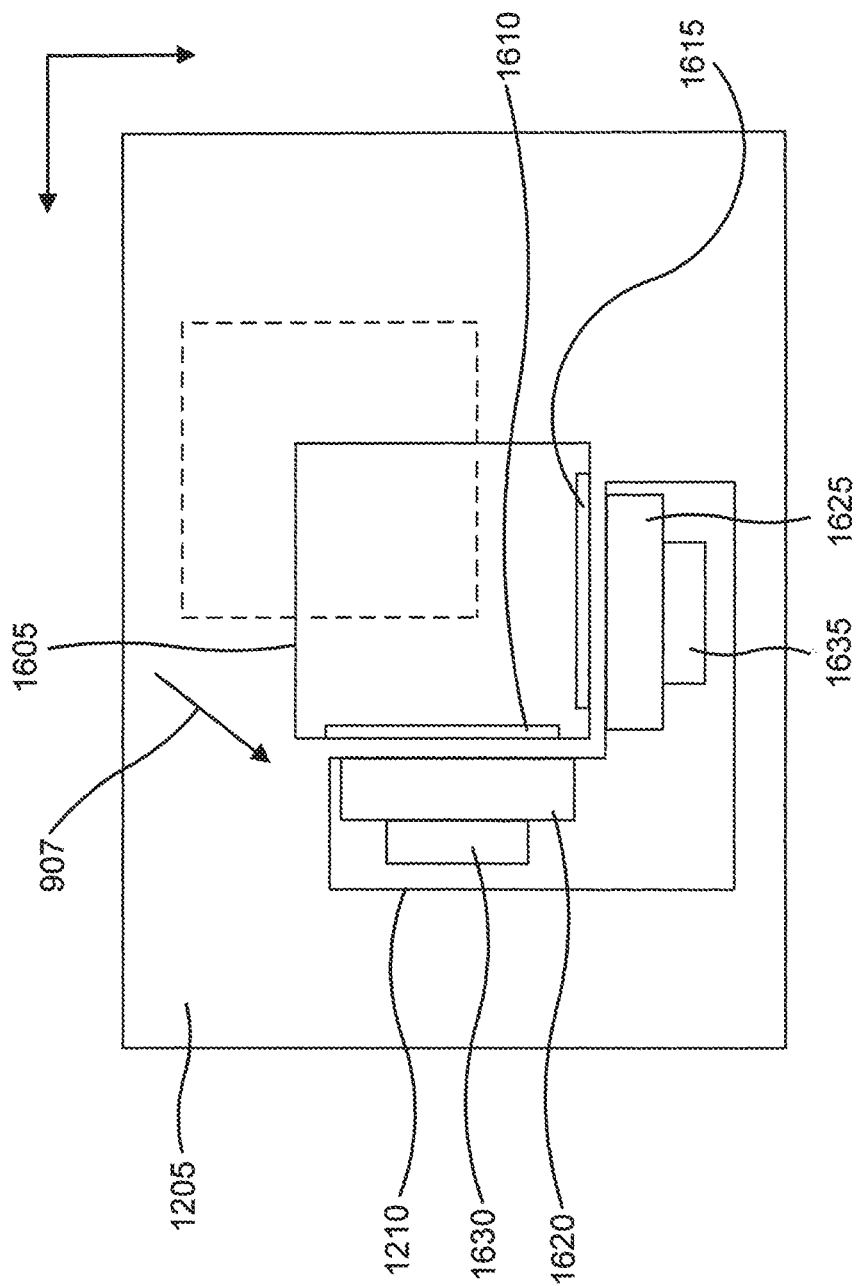

METHODS AND SYSTEMS FOR ALIGNING A COMPONENT

CROSS REFERENCE TO RELATED APPLICATIONS

The present application claims priority to U.S. Provisional Patent Application No. 62/814,565, filed Mar. 6, 2019, titled "Methods and Systems for Aligning a Component", which is incorporated by reference herein in its entirety.

FIELD

The present specification relates to methods and systems for aligning a component, and in particular to methods and systems for aligning a component on a substrate.

BACKGROUND

Systems and devices may be designed to perform a variety of functions. These systems and devices may have multiple components. Moreover, these components may be assembled together to form the systems or devices.

SUMMARY

According to an implementation of the present specification there is provided a method comprising: placing a component on a substrate; extending an alignment member through an opening in the substrate; moving the component to abut against the alignment member to align the component relative to the substrate; securing the component to the substrate; and retracting the alignment member through the opening.

After the moving the component to abut against the alignment member, the alignment member may contact two sides of the component to align the component along two linearly-independent directions on the substrate.

The method may further comprise extending an additional alignment member through an additional opening in the substrate; and retracting the additional alignment member through the additional opening. The moving the component may comprise moving the component to abut against the alignment member and the additional alignment member to align the component along two linearly-independent directions on the substrate.

After the moving the component the alignment member may abut against a first side of the component and the additional alignment member may abut against a second side of the component.

The method may further comprise extending an additional alignment member through the opening in the substrate; and retracting the additional alignment member through the opening. The moving the component may comprise moving the component to abut against the alignment member and the additional alignment member to align the component along two linearly-independent directions on the substrate.

The extending the alignment member may comprise extending at least one of a peg and a shim through the opening in the substrate.

The alignment member may be secured to a support to form a jig; and the extending and the retracting the alignment member may comprise moving one or both of the jig and the substrate closer to and further from one another respectively.

The moving the component may comprise exerting a magnetic force between the alignment member and the component to attract the component towards the alignment member.

The alignment member may comprise an electromagnet; and the exerting the magnetic force may comprise electrifying the electromagnet.

The extending the alignment member may comprise extending the alignment member comprising a permanent magnet through the opening in the substrate.

The method may further comprise providing a quantity of a liquid disposed on the substrate between the substrate and the component. The moving the component may comprise applying a surface tension force of the liquid to the component.

The providing the quantity of the liquid may comprise providing a plurality of sub-quantities of the liquid spaced from one another.

The providing the plurality of the sub-quantities of the liquid may comprise providing the plurality of the sub-quantities arranged periodically on the substrate to form a grid.

The providing the liquid may comprise providing a solder disposed on the substrate between the substrate and the component.

The providing the liquid may comprise providing a solid solder disposed on the substrate between the substrate and the component; and melting the solid solder.

The moving the component may comprise tilting the substrate to cause gravity to pull the component towards the alignment member.

The moving the component may further comprise vibrating the substrate and the component.

The moving the component may further comprise blowing a gas across a surface of the substrate to push the component towards the alignment member.

The securing the component to the substrate may comprise soldering the component to the substrate.

The placing the component on the substrate may comprise placing an optical component on a printed circuit board.

The extending the alignment member may comprise extending the alignment member comprising a solder non-adhesive material through the opening in the substrate.

The extending the alignment member comprising the solder non-adhesive material may comprise extending the alignment member comprising one or more of aluminum and a ceramic through the opening in the substrate.

The moving the component to abut against the alignment member may comprise moving the component along a surface of the substrate.

According to another implementation of the present specification there is provided a system to align a component on a substrate, the system comprising: a substrate holder to hold the substrate; an alignment member; an actuator mechanically coupled to one or both of the substrate holder and the alignment member, the actuator to move one or both of the substrate holder and the alignment member relative to one another between a first configuration in which the alignment member extends through an opening in the substrate and a second configuration in which the alignment member is retracted from the opening; a component moving module to move the component to abut against the alignment member in the first configuration to align the component relative to the substrate; and a component securing module to secure the component to the substrate after the component is aligned relative to the substrate and before the alignment member is retracted from the opening.

The alignment member may be shaped to contact two sides of the component when the component abuts the alignment member, to align the component along two linearly-independent directions on the substrate.

The system may further comprise an additional alignment member, the alignment member and the additional alignment member secured to the support to form a jig. The actuator may be mechanically coupled to one or both of the substrate holder and the jig, the actuator to move one or both of the substrate holder and the jig relative to one another between the first configuration in which the alignment member extends through the opening and the additional alignment member extends through a corresponding additional opening in the substrate and the second configuration in which the alignment member is retracted from the opening and the additional alignment member is retracted from the additional opening; and the component moving module may be to move the component to abut against the alignment member at a first side of the component and to abut against the additional alignment member at a second side of the component, to align the component along two linearly-independent directions on the substrate.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

FIG. 5 shows a schematic top plan view of an example substrate and alignment member to align an example component on the substrate, in accordance with a non-limiting implementation of the present specification.

FIG. 6 shows a schematic top plan view of another example substrate and alignment member to align an example component on the substrate, in accordance with a non-limiting implementation of the present specification.

FIG. 7 shows a schematic top plan view of yet another example substrate and alignment member to align an example component on the substrate, in accordance with a non-limiting implementation of the present specification.

FIG. 10 shows a schematic top plan view of yet another example substrate and alignment member to align an example component on the substrate, in accordance with a non-limiting implementation of the present specification.

FIG. 11 shows a schematic top plan view of yet another example substrate and alignment member to align an example component on the substrate, in accordance with a non-limiting implementation of the present specification.

FIG. 12 shows a schematic top plan view of yet another example substrate and alignment member to align an example component on the substrate, in accordance with a non-limiting implementation of the present specification.

FIG. 13 shows a schematic top plan view of yet another example substrate and alignment member to align an example component on the substrate, in accordance with a non-limiting implementation of the present specification.

FIG. 14 shows a schematic top plan view of yet another example substrate and alignment member to align an example component on the substrate, in accordance with a non-limiting implementation of the present specification.

FIG. 16 shows a schematic top plan view of yet another example substrate and alignment member to align an example component on the substrate, in accordance with a non-limiting implementation of the present specification.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, and the like. In other instances, well-known structures associated with light sources have not been shown or described in detail to avoid unnecessarily obscuring descriptions of the implementations.

Unless the context requires otherwise, throughout the specification and claims which follow, the word "comprise" and variations thereof, such as, "comprises" and "comprising" are to be construed in an open, inclusive sense, that is as "including, but not limited to."

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the implementations.

When assembling components to form a system or device, the components may be placed at predetermined positions and alignments on a substrate, and then secured together or to the substrate. "Positioning" and "aligning" may be used interchangeably to refer to placing a component at the correct position on the substrate, adjusting the orientation of the component to align it relative to the substrate, or both. Examples of substrates may include circuit boards, chassis, frames, and the like. In some examples, spatial tolerances may be adhered to when positioning or aligning the components on the substrate. This may allow the component to be positioned or aligned accurately in the system or device, which may in turn allow the system or device to function properly within its operating specifications.

Figure 1:
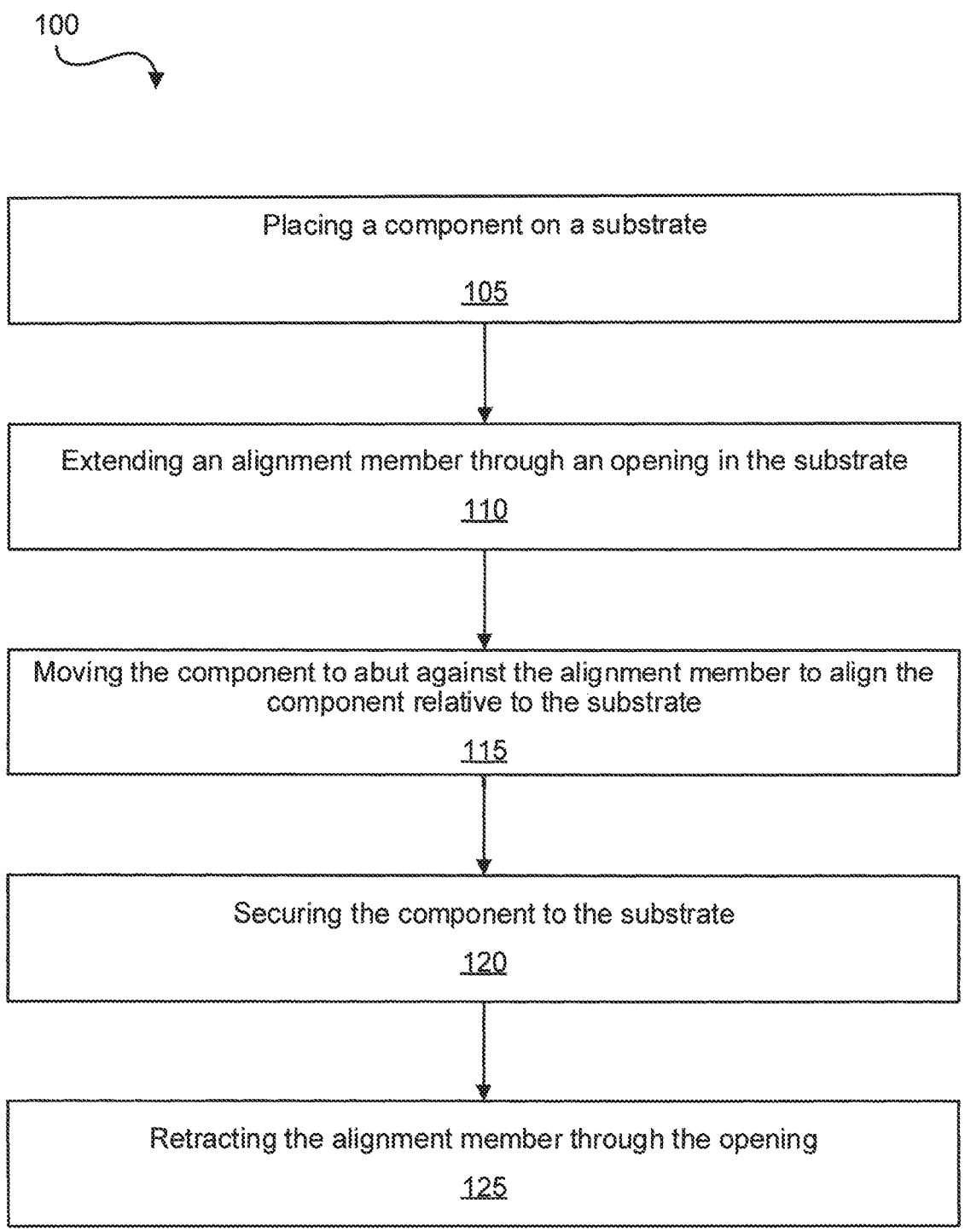
FIG. 1 shows an example method which may be used to align a component on a substrate, in accordance with a non-limiting implementation of the present specification.

In some examples, manufacturing methods used for positioning or aligning components on a substrate may not be able to meet the spatial positioning or alignment tolerances. In such examples, the component may be positioned on the substrate near its predetermined position and with relatively larger spatial positioning or alignment tolerances. Subsequently, the component may be aligned on the substrate by moving the component to its predetermined position within relatively smaller spatial tolerances. FIG. 1 shows an example of such a method, which may be used to position or align a component on a substrate.

Turning now to an example method 100 shown in FIG. 1, at box 105 a component may be placed on a substrate. In some examples, the substrate may comprise a circuit board such as a printed circuit board (PCB), and the component may comprise electrical or optical components to be placed on the PCB. It is contemplated that in some examples components different than optical or electrical components may be positioned on their respective substrates, which substrates may be different than circuit boards. In some examples, the placing of the component on the substrate may be performed as part of a manufacturing technique such as frame-and-reel, pick-and-place, and the like.

Figure 2A:
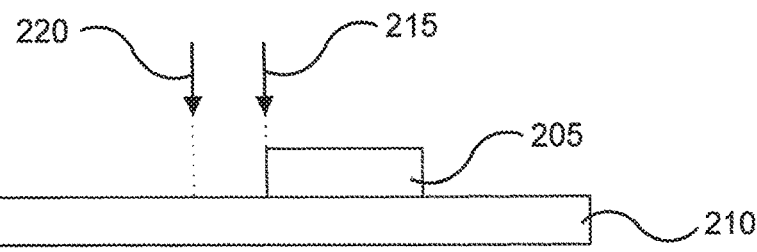
FIGS. 2A, 2B, 2C and 2D show schematic side elevation views of an example set of steps for aligning a component on a substrate, in accordance with a non-limiting implementation of the present specification.

FIGS. 2A, 2B, 2C and 2D show schematic side elevation views of an example implementation of method 100. FIG. 2A shows a component 205 placed on a substrate 210. An arrow 215 marks the position at which component 205 is initially placed on substrate 210. An arrow 220 marks the predetermined position on substrate 210 to which component 205 is to be moved in order to correctly or accurately align component 205 on substrate 210.

At box 110, an alignment member may be extended through an opening in the substrate. The alignment member may extend through a thickness of the substrate and extend beyond the surface of the substrate on which the component is placed. In this manner, the alignment member may be able to act as a positional marker for the correct alignment of the component on the substrate.

Figure 2B:
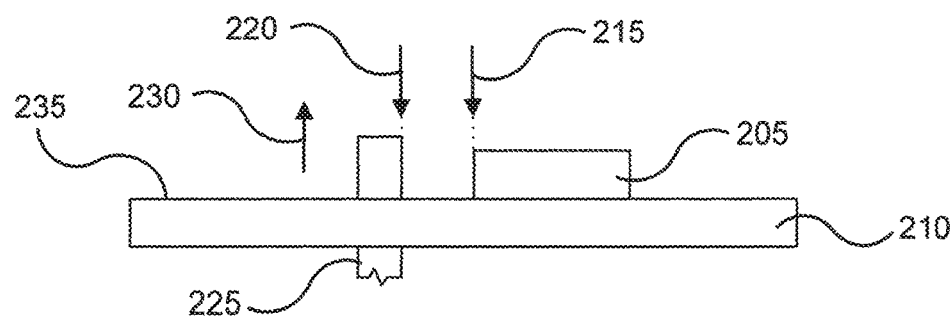

FIG. 2B shows an example implementation of extending an alignment member 225 along a direction of an arrow 230 through substrate 210. As shown in FIG. 2B, alignment member 225 extends through substrate 210 and beyond a surface 235 of substrate 210.

Figure 2C:
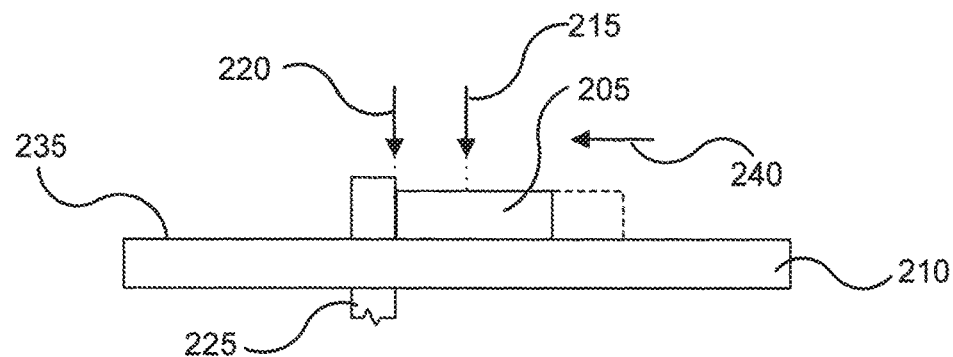

Furthermore, at box 115 of method 100 the component may be moved to abut against the alignment member to align the component relative to the substrate. FIG. 2C shows an example implementation of moving component 205 along the direction of an arrow 240 to abut against alignment member 225. This in turn moves component 205 to its predetermined position marked by arrow 220, thereby aligning component 205 relative to substrate 210. In FIG. 2C the dashed lines show the initial position of component 205 on substrate 210.

Moreover, while FIG. 2C shows alignment member 225 extending above surface 235 further than the height of component 205 above surface 235, it is contemplated that in some examples alignment member 225 may extend above surface 235 at a height that is the same as or less than the height of component 205. In addition, component 205 may be moved on surface 235 towards alignment member 225 using different mechanisms or forces, as is described in greater detail below. Some examples of such forces or mechanisms may include gravity, a magnetic force, a surface tension force, and the like.

Returning to FIG. 1, at box 120 the component may be secured to the substrate. The component may be secured to the substrate using a suitable method including using solder, using an adhesive, applying a coating to cover the component and the substrate, and the like. In the example of FIG. 2C, once component 205 is moved to its predetermined position marked by arrow 220, then component 205 may be secured to substrate 210.

Figure 2D:
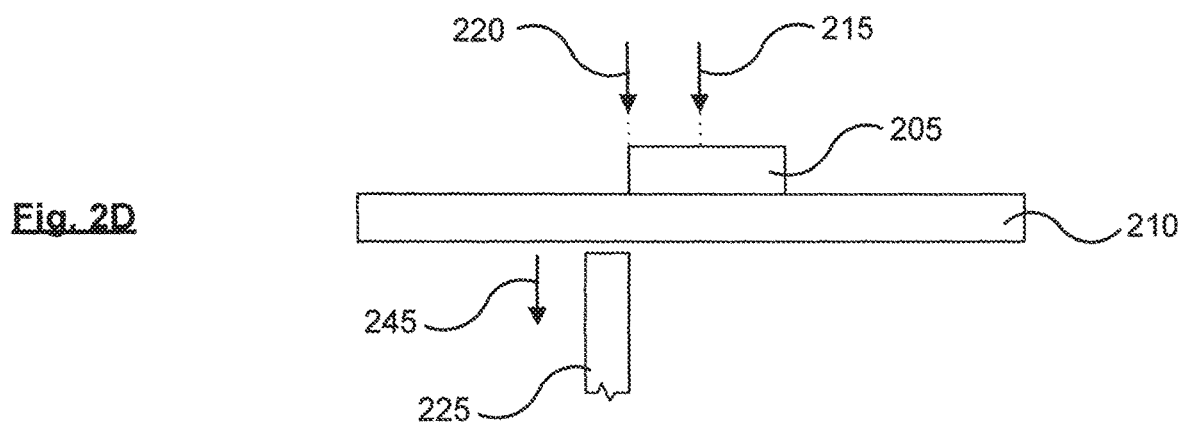

At box 125 of method 100, the alignment member may be retracted through the opening in the substrate. FIG. 2D shows alignment member 225 retracted from substrate 210 along the direction of an arrow 245. In this manner, as shown in FIGS. 1 and 2A-2D, the alignment member may be used to refine the position of the component on the substrate, thereby aligning the component on the substrate.

In some examples, more than one alignment member may be extended through the opening in the substrate. Moreover, in some examples the substrate may comprise more than one opening, and one or more alignment members may be extended through each of the openings. In examples where one alignment member contacts one side of the component, the alignment member may be used to align the component in one direction. For example, if surface 235 (shown in FIG. 2C) of the substrate is described as forming an XY Cartesian plane, the one alignment member may allow the component to be aligned along one direction, such as the X-axis.

In some examples, one alignment member may be shaped to contact two different sides of the component when the component is moved to abut against the alignment member. In some examples, such alignment members may be L-shaped, C-shaped, or have other suitable shapes. Such an alignment member may be used to align the component along two linearly-independent directions on the substrate, such as along both the X-axis and the Y-axis. Alignment along two linearly-independent directions may allow the position of the component to be specified on the Cartesian plane of the surface of the substrate.

Moreover, in some examples, two different alignment members may be used to align the component along two linearly-independent directions on the substrate. In some examples, each of the two alignment members may be positioned to contact a different surface of the component when the component is moved to abut against the two different alignment members.

Figure 3A:
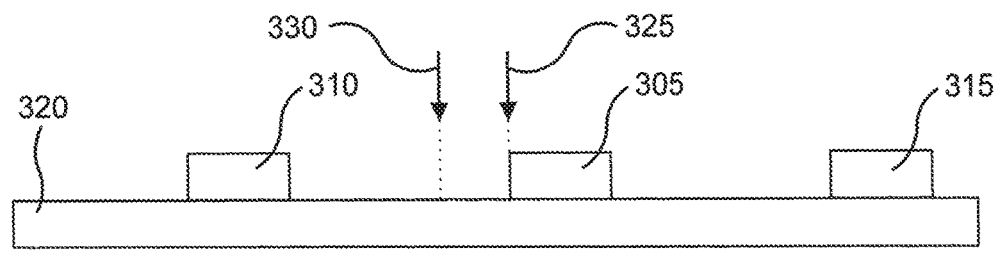
FIGS. 3A, 3B, 3C and 3D show schematic side elevation views of an example set of steps for aligning multiple components on a substrate, in accordance with a non-limiting implementation of the present specification.

Furthermore, in some examples multiple alignment members may be used to align multiple components on a substrate. FIGS. 3A, 3B, 3C and 3D show schematic side elevation views of an example set of steps for aligning multiple components using multiple alignment members. FIG. 3A shows components 305, 310, and 315 placed on a substrate 320. While FIG. 3A shows three components, it is contemplated that one, two, four, or a different number of components may be placed and aligned on a substrate using the methods described herein. Moreover, while components 305, 310, and 315 are shown as being identical in size and shape, it is contemplated that in some examples the components may be different from one another in shape, size, composition, functionality, and the like.

FIG. 3A shows that component 305 is initially placed on substrate 320 at the position marked by arrow 325. The predetermined position for component 305, i.e. the correct or accurate alignment of component 305 on substrate 320, is marked by arrow 330. While not marked by arrows in FIG. 3A, components 310 and 315 may also be initially offset from their correct or accurate positions on substrate 320.

Figure 3B:
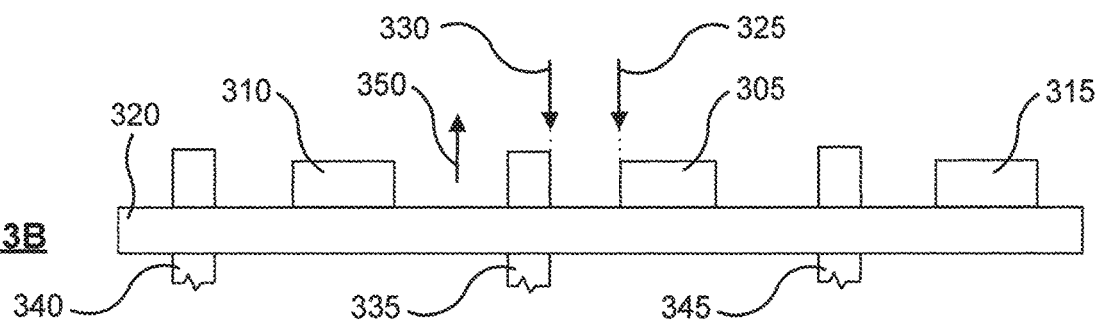

FIG. 3B in turn shows alignment members 335, 340, and 345 being extended through respective openings in substrate 320 along the direction of arrow 350. Alignment members 335, 340, and 345 may be used to align components 305, 310, and 315 respectively. While FIG. 3B shows alignment members 335, 340, and 345 as being identical in shape and size, it is contemplated that in some examples the alignment members may be different from one another in shape, size, composition, and the like.

Figure 3C:
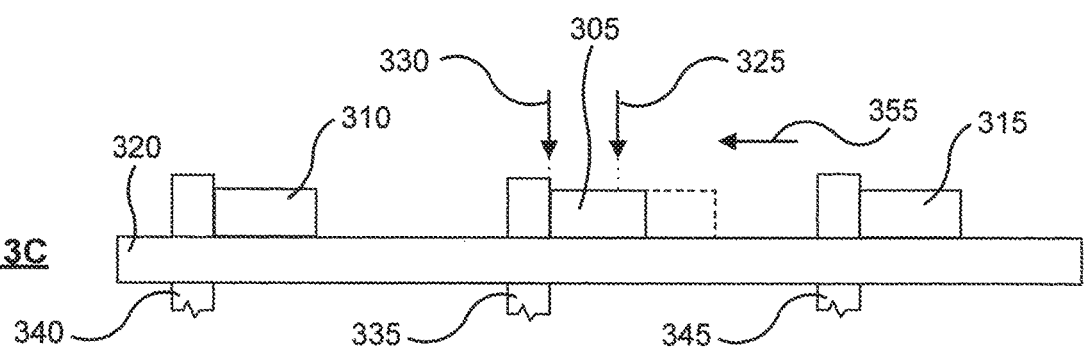
Figure 3D:
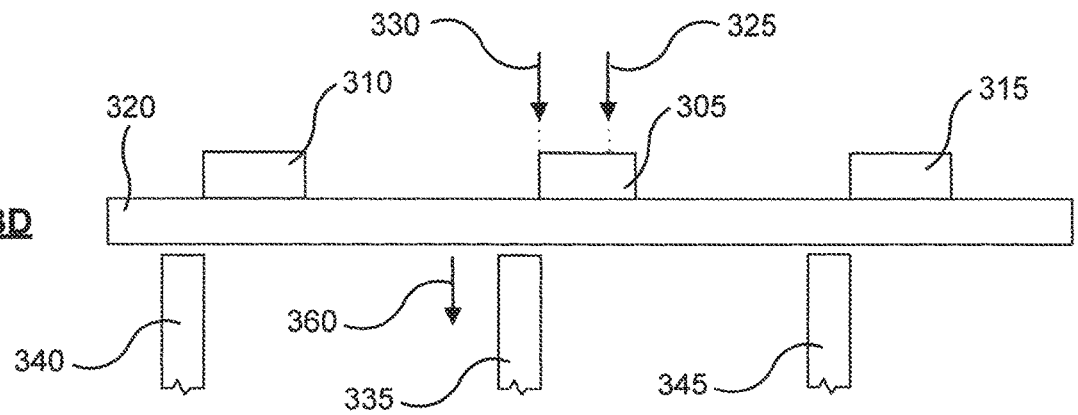

In FIG. 3C, components 305, 310, and 315 are moved on substrate 320 along the direction of an arrow 355 to abut against alignment members 335, 340, and 345 respectively, to align components 305, 310, and 315 relative to substrate 320. Once aligned, components 305, 310, and 315 may be secured to substrate 320. Moreover, once the alignment and securing of the components are completed, alignment members 335, 340, and 345 may be retracted from substrate 320 along a direction marked by an arrow 360, as shown in FIG. 3D.

Turning now to FIGS. 4A, 4B, 4C and 4D, schematic side elevation views are shown of an example set of steps for aligning multiple components using multiple alignment members. FIGS. 4A, 4B, 4C and 4D are similar to FIGS. 3A, 3B, 3C and 3D, with one difference being that alignment members 405, 410, and 415 may be connected to a support 420 to form a jig 425. In this manner, alignment members 405, 410, and 415 may be aligned relative to one another, and may be extended or retracted together as parts of jig 425. In some examples, extending and retracting the alignment members may comprise moving one or both of the jig and the substrate closer to and further from one another respectively.

While alignment members 405, 410, and 415 may be connected together to form jig 425, alignment members 405, 410, and 415 may be otherwise similar to alignment members 335, 340, and 345. Moreover, the shape and size of alignment members 405, 410, and 415 and their positions in jig 425 may correspond respectively to the shape, size, and distribution of the openings in substrate 320.

Figure 4A:
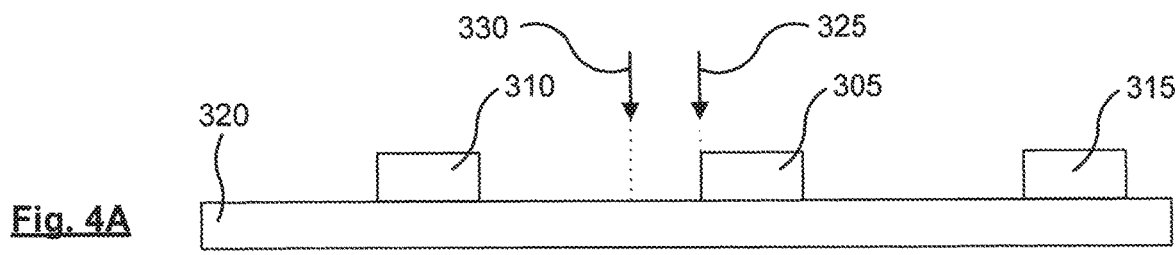
FIGS. 4A, 4B, 4C and 4D show schematic side elevation views of another example set of steps for aligning multiple components on a substrate, in accordance with a non-limiting implementation of the present specification.
Figure 4B:
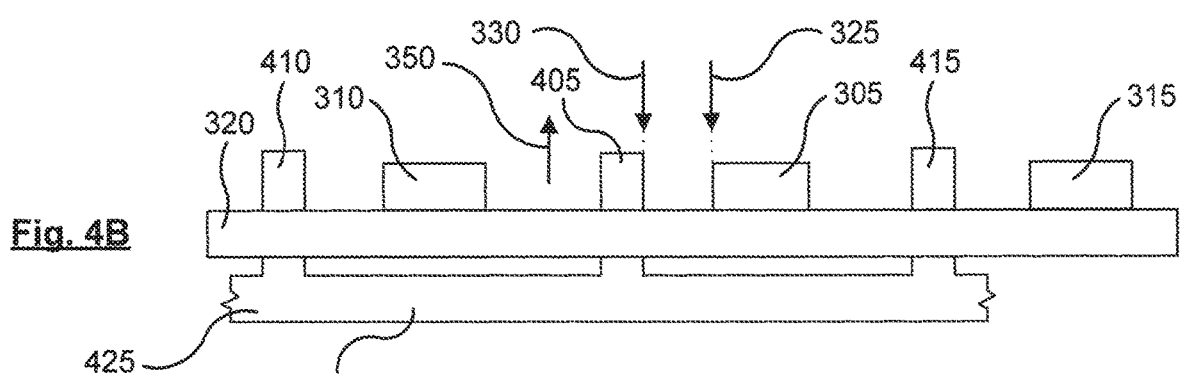
Figure 4C:
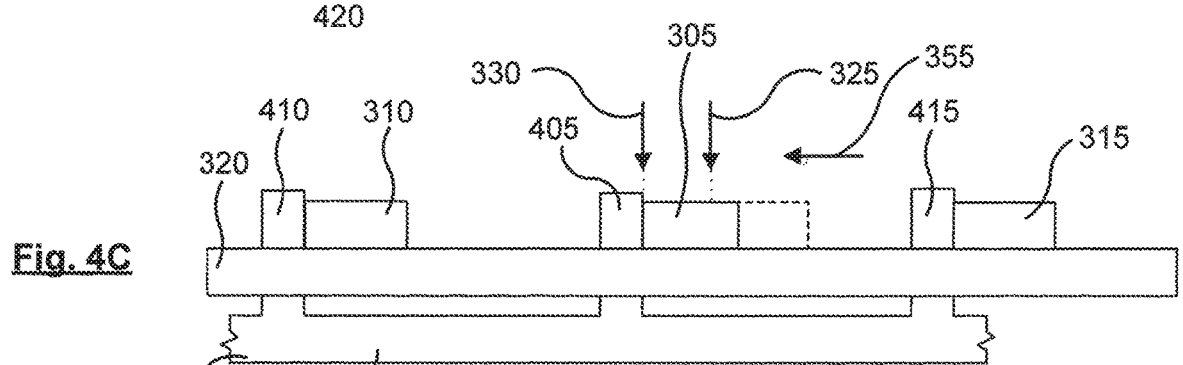
Figure 4D:
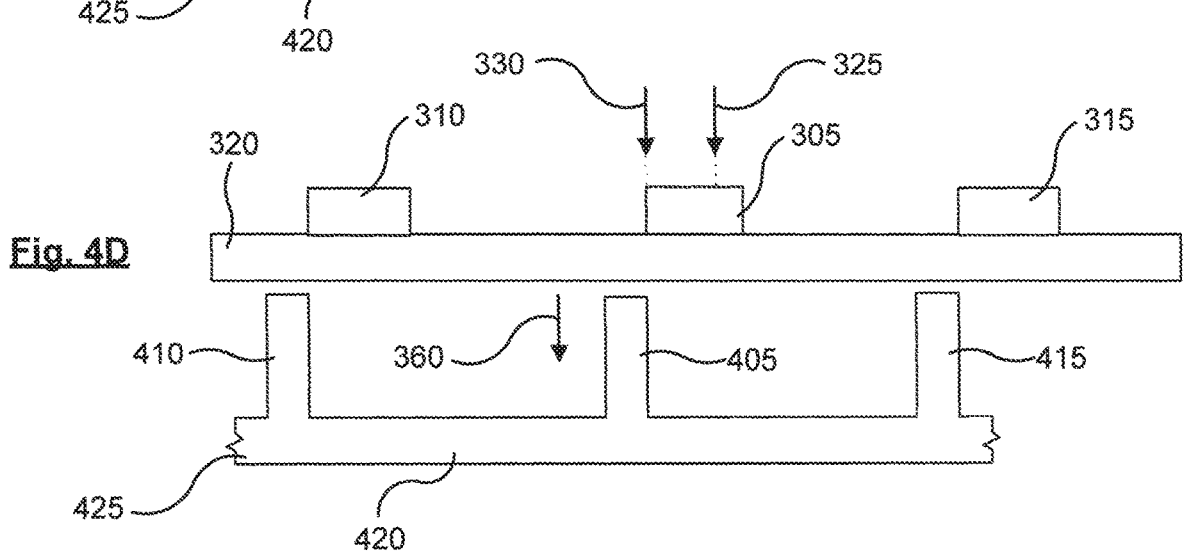

Furthermore, while FIGS. 4B, 4C, and 4D show jig 425 as comprising three identical and evenly spaced alignment members 405, 410, and 415, it is contemplated that in some examples jigs may comprise a number, shapes, sizes, or positions of alignment members in the jig that may be different than those of jig 425 shown in FIGS. 4B, 4C, and 4D.

Turning now to FIG. 5, a schematic top plan view is shown of an example component 505 placed on an example substrate 510. The initial position of component 505 on substrate 510 is shown in dashed lines. While FIG. 5 shows component 505 as being square-shaped, it is contemplated that in some examples the component may have a shape other than a square. An alignment member 515 is extended through an opening 520 in substrate 510, and component 505 is moved along the direction shown by an arrow 530 to abut against alignment member 515. In this manner, component 505 may be aligned relative to substrate 510. In addition, it is contemplated that in some examples component 505 may be moved to abut against alignment member 515 along a path or direction different than the direction shown by arrow 530.

While FIG. 5 shows alignment member 515 being positioned against a side 525 of opening 520, it is contemplated that in some examples the alignment member may be positioned differently in the opening. For example, the alignment member may be about centered in the opening, may be positioned against a different side of the opening, and the like.

Moreover, as shown in FIG. 5, alignment member 515 may be elongated. Such alignment members may also be described as shims, walls, wall segments, and the like. It is contemplated that in some examples the alignment member may have an elongated shape different than the shape shown in FIG. 5. For examples, the alignment member may be elongated and have rounded corners, rounded ends, and the like. Similarly, it is contemplated that in some examples the opening may have a shape different than the shape shown in FIG. 5, so long as the shape allows for the extending and retracting of the alignment member.

Turning now to FIG. 6, a schematic top plan view is shown of example component 505 placed on example substrate 510. FIG. 6 may be similar to FIG. 5, with one difference being that in FIG. 6 two circular alignment members 605 and 610 are extended through opening 520, instead of alignment member 515. In FIG. 6, alignment members 605 and 610 are positioned against side 525 of opening 520. It is contemplated that in other examples alignment members 605 and 610 may be positioned differently in opening 520.

As alignment members 605 and 610 have a rounded or circular cross-section as shown in FIG. 6, alignment members 605 and 610 may also be described as pegs. It is contemplated that in other examples pegs of other cross-sectional shapes may be used such as square pegs, triangular pegs, hexagonal pegs, oval pegs, and the like. In addition, FIG. 6 shows alignment members 605 and 610 as having identical circular cross-sections. It is contemplated that in some examples, alignment members 605 and 610 may have different shapes or sizes from one another. Furthermore, FIG. 6 shows two pegs extending through opening 520. It is contemplated that in some examples one, three, or a different number of alignment members may be extended through opening 520.

Turning now to FIG. 7, a schematic top plan view is shown of example component 505 placed on an example substrate 705. Substrate 705 may be similar to substrate 510, with one difference being that substrate 705 may comprise a circular opening 710, through which a circular alignment member 715 extends. Alignment member 715 is disposed eccentrically in opening 710. It is contemplated that in some examples, alignment member 715 may be disposed differently in opening 710. Moreover, in some examples, opening 710 or alignment member 715 may have a shape different than circular.

Figure 8:
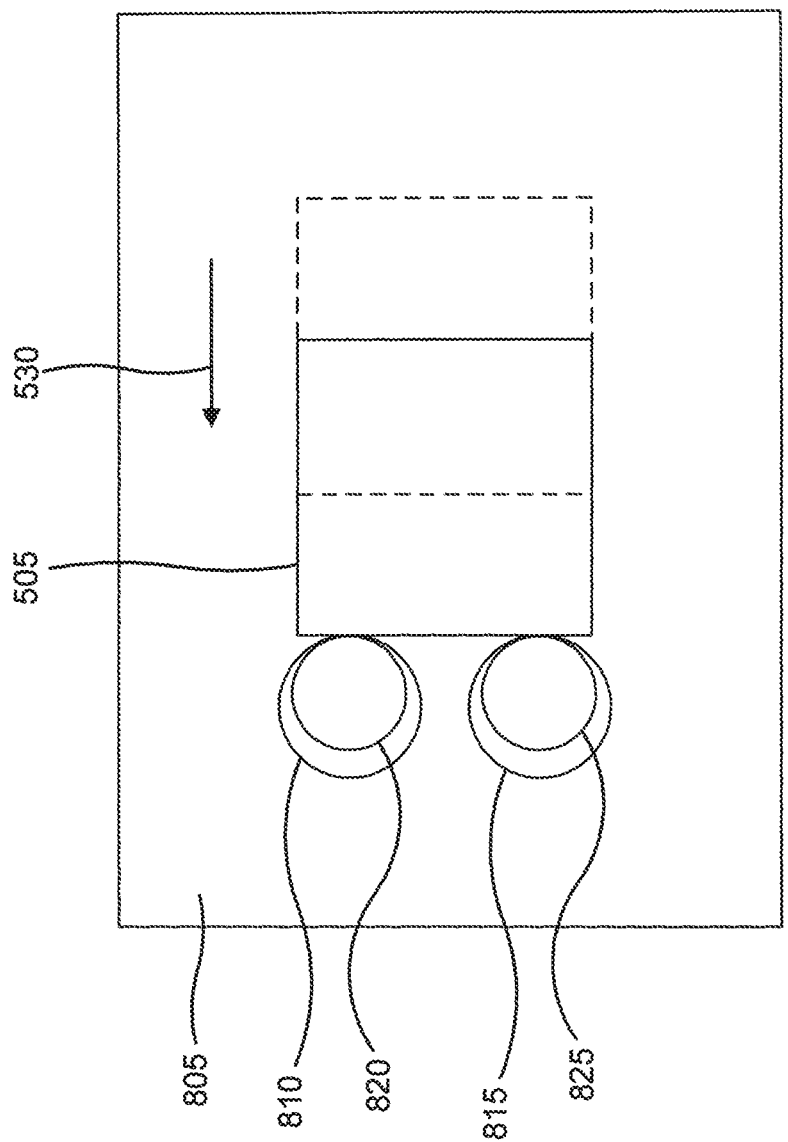
FIG. 8 shows a schematic top plan view of yet another example substrate and alignment member to align an example component on the substrate, in accordance with a non-limiting implementation of the present specification.

FIG. 8, in turn, shows a schematic top plan view of example component 505 placed on an example substrate 805. Substrate 805 may be similar to substrate 705, with one difference being that substrate 805 comprises two circular openings 810 and 815, and two alignment members 820 and 825 extending respectively through openings 810 and 815.

Figure 9:
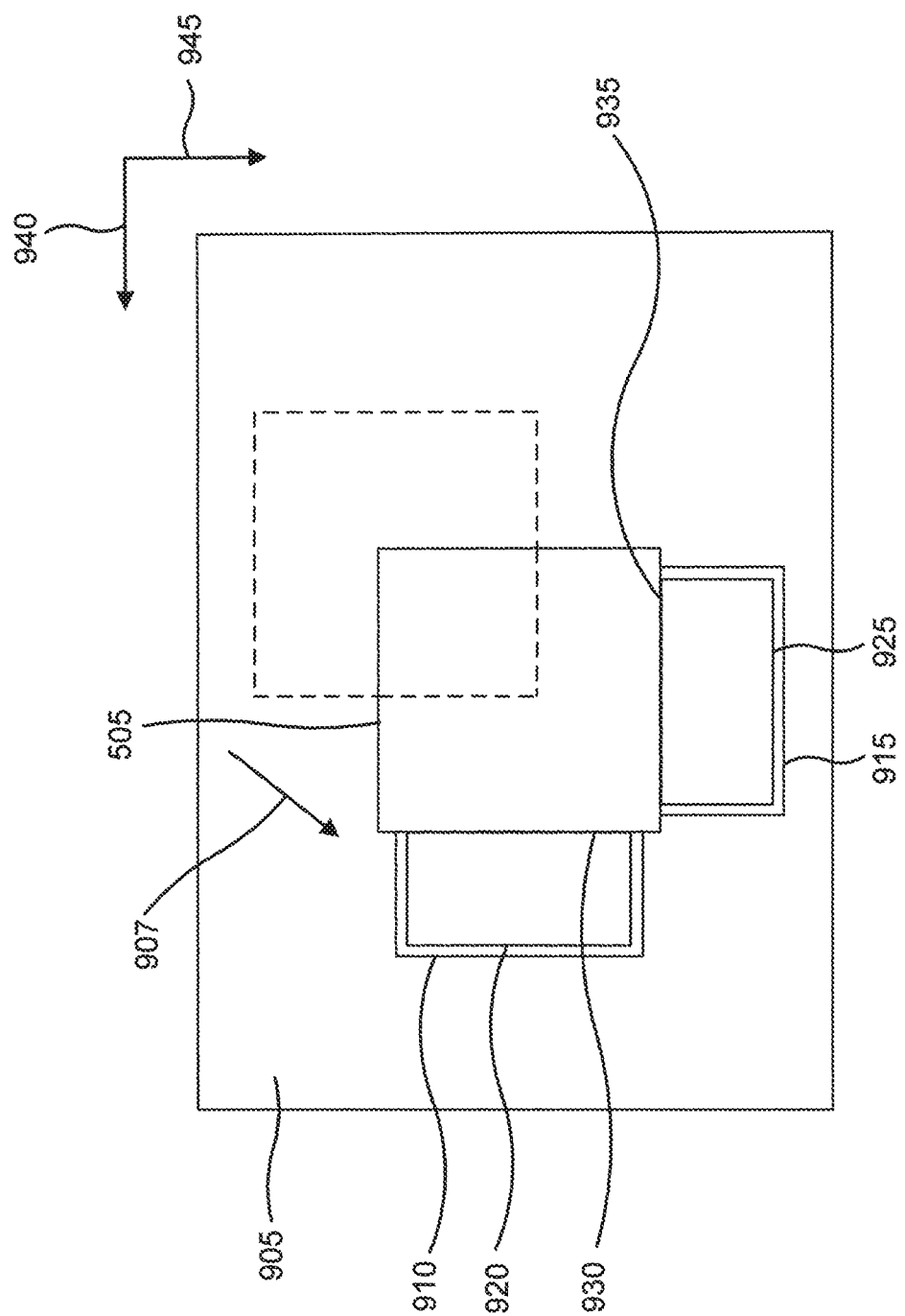
FIG. 9 shows a schematic top plan view of yet another example substrate and alignment member to align an example component on the substrate, in accordance with a non-limiting implementation of the present specification.
Figure 15A:
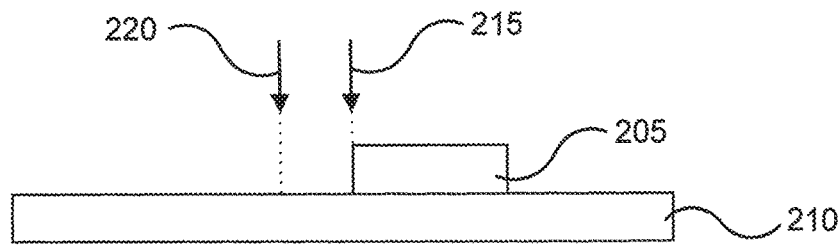
FIGS. 15A, 15B, 15C and 15D show schematic side elevation views of another example set of steps for aligning a component on a substrate, in accordance with a non-limiting implementation of the present specification.
Figure 15B:
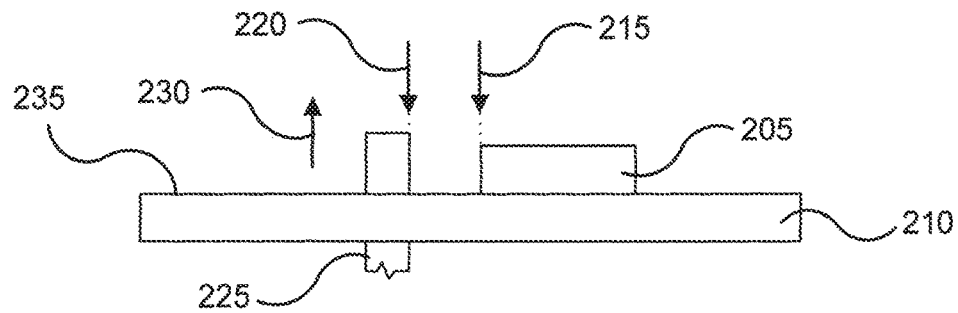
Figure 15C:
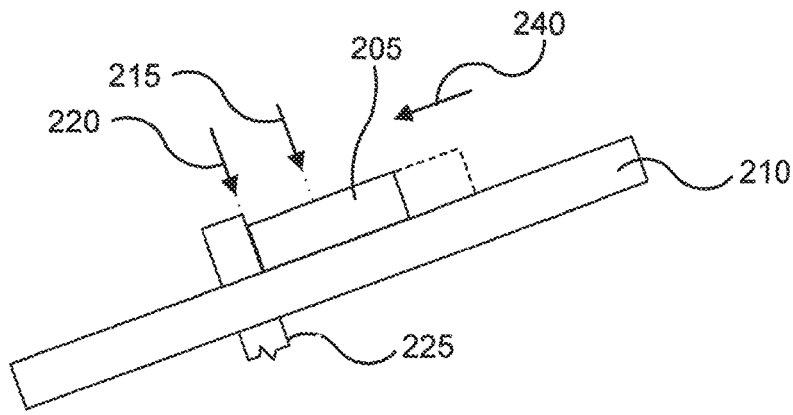
Figure 15D:
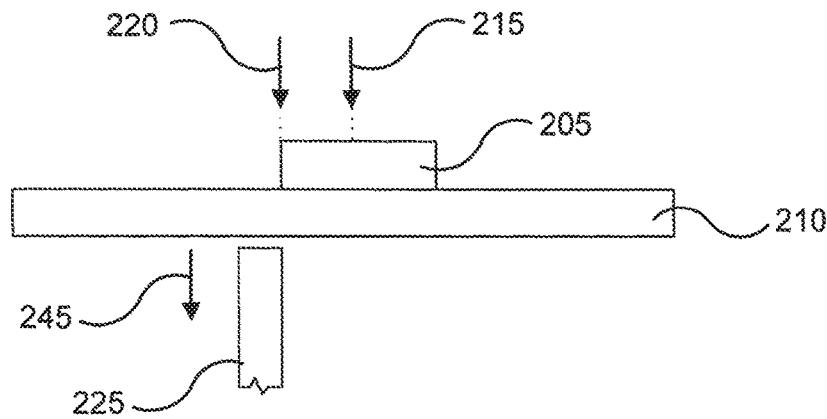

Turning now to FIG. 9, a schematic top plan view is shown of example component 505 placed on an example substrate 905. Substrate 905 may be similar to substrate 805, with one difference being that substrate 905 comprises two rectangular openings 910 and 915. Two alignment members 920 and 925 may extend through openings 910 and 915. While alignment members 920 and 925 are depicted as being disposed eccentrically and against one side of openings 910 and 915, it is contemplated that in some examples the alignment members may be positioned differently in the openings.

The initial position of component 505 on substrate 905 is shown in dashed lines. Component 505 may be moved, for example along the direction of arrow 907, to abut against alignment members 920 and 925. Moreover, it is contemplated that in some examples component 505 may be moved to abut against alignment members 920 and 925 along a path or direction different than the direction shown by arrow 907.

In the abutting configuration, alignment member 920 contacts a first side 930 of component 505, and alignment member 925 contacts a second side 935 of component 505. Alignment members 920 and 925 contacting two different sides of component 505 may in turn allow component 505 to be aligned on substrate 905 along two linearly independent directions, such as the directions marked by arrows 940 and 945.

FIG. 10, in turn, shows a schematic top plan view of example component 505 placed on example substrate 905. In FIG. 10, two alignment members 1005 and 1010 with circular cross-sections extend through opening 910, and two alignment members 1015 and 1020 also with circular cross-sections extend through opening 915. It is contemplated that in some examples, different numbers, shapes, or sizes of alignment members may extend through openings 910 and 915.

Turning now to FIG. 11, a schematic top plan view is shown of example component 505 placed on an example substrate 1105. Substrate 1105 may be similar to substrate 905, with one difference being that substrate 1105 comprises two circular openings 1110 and 1115. Two alignment members 1120 and 1125 extend respectively through openings 1110 and 1115. While alignment members 1120 and 1125 are shown as being disposed eccentrically in openings 1110 and 1115 respectively, it is contemplated that in some examples the alignment members may be disposed differently in openings 1110 and 1115.

FIG. 12, in turn, shows a schematic top plan view of example component 505 placed on an example substrate 1205. Substrate 1205 may be similar to substrate 905, with one difference being that opening 1210 in substrate 1205 is L-shaped. Alignment members 920 and 925 may extend through opening 1210. The shape of opening 1210 may be described as corner-shaped, angled, L-shaped, wrap-around, or the like. The shape of opening 1210 may allow multiple alignment members to extend through opening 1210, which alignment members may abut against two different sides of component 505.

Moreover, FIG. 13 shows a schematic top plan view of example component 505 placed on example substrate 1205, with alignment members 1120 and 1125 extending through opening 1210. Alignment member 1120 extends through one arm of the L-shaped opening 1210, while alignment member 1125 extends through the second arm of opening 1210. This positioning of alignment members 1120 and 1125 may allow the alignment members to contact two different sides of component 505, thereby allowing component 505 to be aligned along two linearly independent directions on substrate 1205.

Furthermore, FIG. 14 shows a schematic top plan view of example component 505 placed on example substrate 1205. An alignment member 1405 extends through opening 1210. Alignment member 1405 is in turn L-shaped, which allows one arm of alignment member 1405 to come into contact with a first side of component 505, while the second arm of alignment member 1405 may come into contact with a second side of component 505. This, in turn, may allow component 505 to be aligned along two linearly independent directions on substrate 1205. In addition, while alignment member 1405 is shown as being disposed eccentrically, or against one side of, opening 1210, it is contemplated that in some examples alignment member 1405 may be disposed differently in opening 1210.

Turning now to FIGS. 15A, 15B, 15C, and 15D, schematic side elevation views are shown of an example set of steps for aligning a component on a substrate. FIGS. 15A, 15B, 15C, and 15D may be similar to FIGS. 2A, 2B, 2C, and 2D, with one difference being that in FIG. 15C substrate 210 is tilted. This tilting may cause the force of gravity to move or pull component 205 towards alignment member 225.

In some examples, tilting may be combined with mechanical agitation such as vibration of substrate 210 and component 205. Such mechanical agitation may assist with moving component 205 towards alignment member 225. In addition, in some examples tilting may be combined with blowing a gas across a surface of substrate 210 to push component 205 towards alignment member 225. Examples of the gas may include air, nitrogen, and the like. It is contemplated that in some examples a combination of mechanical agitation and blowing the gas across the substrate may be used to move the component. In such examples, moving the component need not comprise tilting the substrate.

Once component 205 is moved to abut against alignment member 225, in some examples component 205 may be secured to substrate 210 while substrate 210 is tilted and alignment member 225 is extended through the opening in substrate 210. Moreover, in some examples, after component 205 is moved to abut against alignment member 225, substrate 210 is untilted and then component 205 is secured to substrate 210, before alignment member 225 is retracted through the opening in substrate 210. Furthermore, in some examples, after component 205 is moved to abut against alignment member 225, substrate 210 is untilted and alignment member 225 is retracted through the opening in substrate 210, before component 205 is secured to substrate 210.

Turning now to FIG. 16, a schematic top plan view is shown of an example component 1605 placed on example substrate 1205. Component 1605 may comprise side wall modules 1610 and 1615, which may comprise magnetic or magnetizable materials, such as iron-containing materials and the like. Alignment members 1620 and 1625 may extend through opening 1210 in substrate 1205. Alignment members 1620 and 1625 may be coupled to magnetic modules 1630 and 1635 respectively. Magnetic modules 1630 and 1635 may comprise permanent magnets, or electromagnets which become magnetic when electrified.

A magnetic attractive force between side wall modules 1610 and 1615 of component 1605 and magnetic modules 1630 and 1635 respectively may be used to move component 1605 towards alignment members 1620 and 1625. In some examples, alignment members 1620 and 1625 may comprise permanent or electro magnets, in which case the alignment members need not be coupled to magnetic modules 1630 and 1635. Moreover, in some examples component 1605 may comprise or be formed on a magnetic or magnetizable material, instead of or in addition to comprising side wall modules 1610 and 1615. Examples of such magnetizable materials may include Kovar™, and the like.

FIG. 16 shows the use of magnetic attractive forces to move component 1605 in relation to substrate 1205 having an L-shaped opening 1210 through which two elongated alignment members 1620 and 1625 may extend. It is also contemplated that magnetic attractive forces may be used in the examples where the substrates have different numbers or shapes of openings, through which different numbers or shapes of alignment members may extend.

In some examples, a surface tension force may be used to move the component along the surface of the substrate and towards the alignment members. In order to use the surface tension force, a quantity of a liquid may be disposed on the substrate between the substrate and the component. As the liquid wets the component, the surface tension of the liquid may exert a force on the component which may move the component along the surface of the substrate. The placement and or distribution of the liquid on the substrate may be used to set the direction or path of the movement of the component.

Figure 17:
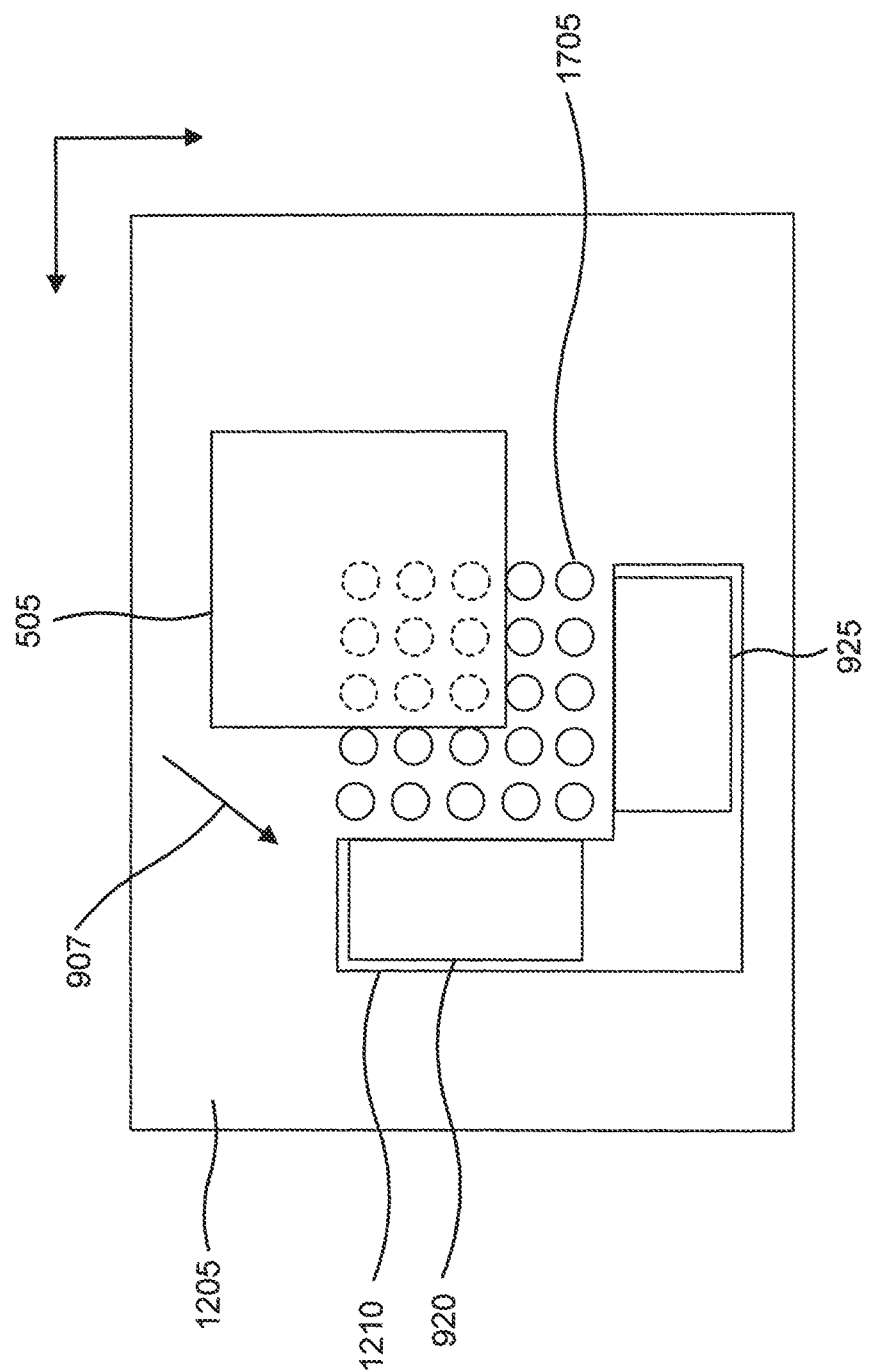
FIG. 17 shows a schematic top plan view of yet another example substrate and alignment member to align an example component on the substrate, in accordance with a non-limiting implementation of the present specification.

In some examples the quantity of the liquid may comprises a plurality of sub-quantities of the liquid spaced from one another. Moreover, in some examples the sub-quantities may be arranged periodically on the substrate to form a grid. FIG. 17 shows an example of a grid of sub-quantities of a liquid. FIG. 17 shows a schematic top plan of an example component 505 placed on example substrate 1205. A grid of periodically arranged liquid sub-quantities 1705 may be placed on substrate 1205. Some of the liquid sub-quantities are shown in dashed lines to indicate that they are obscured by component 505 in the plan view shown in FIG. 17.

As liquid sub-quantities 1705 wet component 505, their surface tension force may pull component 505 over and on top of liquid sub-quantities 1705, thereby pulling component 505 towards alignment members 920 and 925. In some examples, the liquid may comprise solder, which may also be used to secure component 505 to substrate 1205 once the solder solidifies. In some examples the solder may be provided in solid form disposed on the substrate, and then the solder may be melted to form the liquid quantity or sub-quantities on the substrate. In such examples, the component may be placed on the solder either before or after the solder is melted.

Furthermore, while FIG. 17 shows a five-by-five array or gird of liquid sub-quantities, it is contemplated that in some examples the liquid may be distributed or arranged differently on the substrate. Moreover, in some examples the position of the liquid sub-quantities on the substrate may determine the position or alignment of the component on the substrate. In such examples, the component may be aligned on the substrate without the use of alignment members. In addition, while FIG. 17 shows liquid sub-quantities 1705 disposed on substrate 1205 through whose opening 1210 alignment members 920 and 925 may extend, it is contemplated that liquid quantities or sub-quantities may be used to move components disposed on other substrates cooperating with different types of alignment members.

FIGS. 5-17 show one component being aligned on a substrate. It is also contemplated that the substrates, alignment members, and component moving techniques described in relation to FIGS. 5-17 may be used to move and align multiple components on a substrate. Moreover, FIGS. 5-17 show openings in the substrate that are rectangular, circular, or L-shaped. It is contemplated that in some examples the openings may have shapes other than rectangular, circular, and L-shaped. In addition, it is contemplated that in some examples the openings may comprise slits or notches in the substrate.

Furthermore, as discussed above, once the component is aligned on the substrate the component may be secured to the substrate by soldering the component to the substrate before the alignment member is retracted from the substrate. In order to reduce the likelihood of the solder adhering to the alignment members, the alignment members may comprise a solder non-adhesive material such as aluminum, a ceramic, and the like. In some examples, the alignment members may be coated in solder non-adhesive material. Moreover, in some examples the alignment members may be made of, or otherwise comprise, solder non-adhesive material.

Referring to FIG. 1 and method 100, it is contemplated that in some examples the steps of method 100 may be performed in an order different than the order shown in FIG. 1. For example, while in FIG. 1 the "securing" in box 120 appears before the "retracting" in box 125, it is contemplated that in method 100 and the other methods described herein the alignment member may be retracted through the opening before the component is secured to the substrate.

Figure 18B:
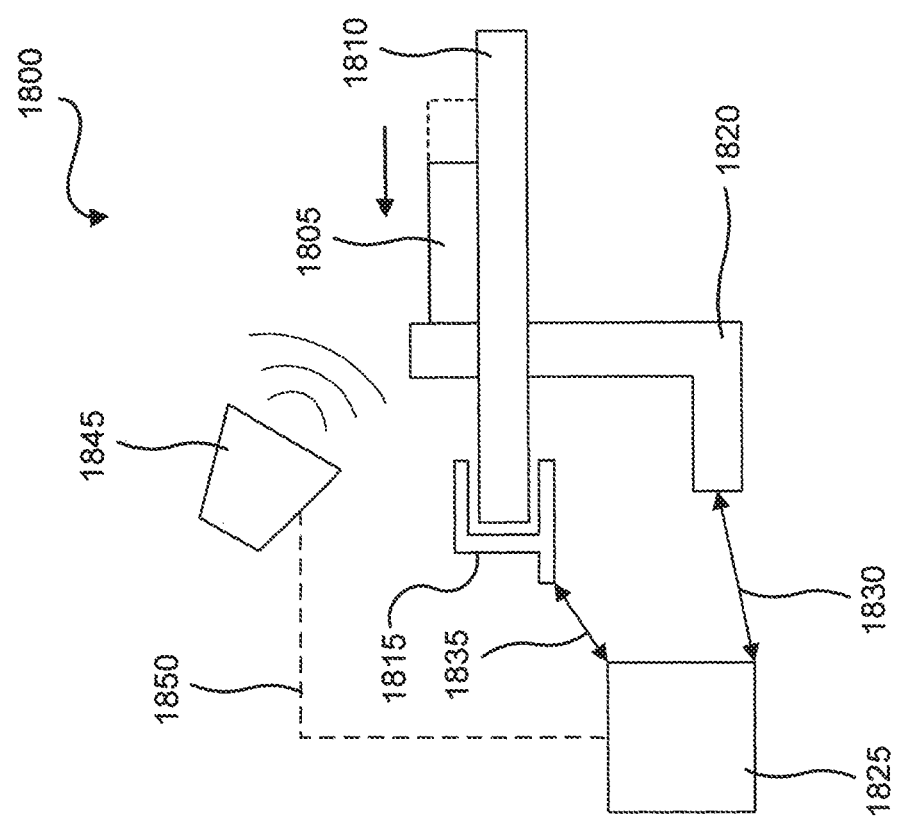
FIGS. 18A and 18B show schematic views of an example system to align an example component on an example substrate, in accordance with a non-limiting implementation of the present specification.
Figure 18A:
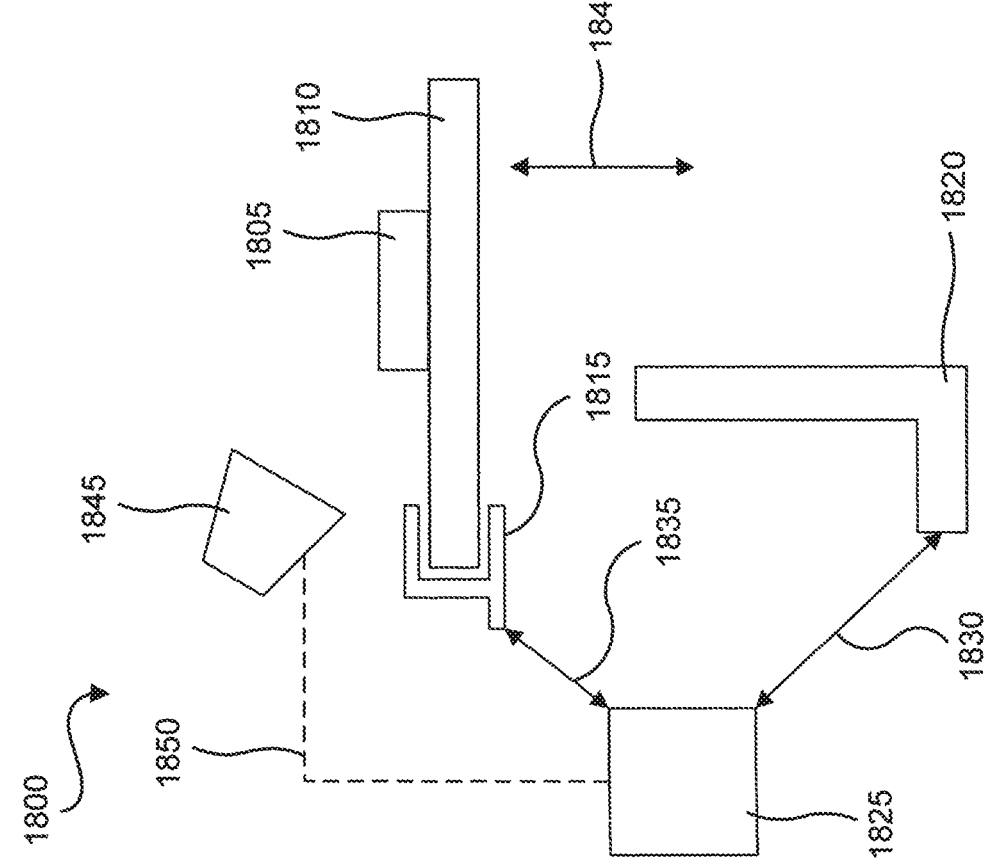

Turning now to FIGS. 18A and 18B, schematic representations are shown of an example system 1800, which may be used to align a component 1805 on a substrate 1810. Component 1805 and substrate 1810 may be similar to the other components and substrates described herein. System 1800 comprises a substrate holder 1815 to hold substrate 1810. In some examples substrate holder 1815 may comprise a reversible mechanical coupler to allow substrate 1810 to be secured to substrate holder 1815 during the operation of system 1800, and then for substrate 1810 to be removed from substrate holder 1815 after component 1805 is aligned on and secured to substrate 1810.

System 1800 may also comprise an alignment member 1820, which may be extendable through an opening in substrate 1810 to assist in aligning component 1805, as described herein in relation to FIGS. 1-17. It is contemplated that in some examples alignment member 1820 may have a shape or size different than those shown in FIGS. 18A and 18B. For example, it is contemplated that the alignment member in system 1800 may have a shape, size, and number or arrangement of alignment members similar to those described herein in relation to FIGS. 1-17. In addition, it is contemplated that in some examples the alignment member may be a component of a jig, such as jig 425 (shown in FIG. 4D) and the like.

In addition, system 1800 may comprise an actuator 1825 mechanically coupled to alignment member 1820 via coupling 1830, and mechanically coupled to substrate holder 1815 via coupling 1835. Actuator 1825 may comprise a source of mechanical actuation, such as an electric motor, a servo, and the like. Couplings 1830 and 1835 may comprise direct or indirect mechanical couplings, which may be used to transmit the mechanical force generated by actuator 1825 to alignment member 1820 and substrate holder 1815 respectively. In this manner, actuator 1825 may be able to move alignment member 1820 and substrate holder 1815 relative to one another to bring them closer together or further away from one another. FIG. 18A shows alignment member 1820 and substrate holder 1815 in a configuration where alignment member 1820 is retracted from the opening in substrate 1810.

While FIG. 18A shows actuator 1825 being mechanically coupled to and moving both substrate holder 1815 and alignment member 1820, it is contemplated that in some examples the actuator may be mechanically coupled to and capable of moving one of the alignment member and the substrate holder. Arrow 1840 shows a set of directions along which actuator 1825 may move one or both of substrate holder 1815 and alignment member 1820 closer to or further from one another. Moreover, in examples where the alignment member is part of a jig, actuator 1825 may be mechanically coupled to the jig. In addition, it is contemplated that in some examples the substrate holder and the alignment member may be mechanically coupled to and actuated by separate actuators.

System 1800 may also comprise a component moving module to move component 1805 to abut against alignment member 1820 in the configuration shown in FIG. 18B, in which configuration alignment member 1820 extends through an opening in substrate 1810. This, in turn, may be used to align component 1805 relative to substrate 1810.

In some examples, the component moving module may be incorporated into another part or module of system 1800. For example, substrate holder 1815 and actuator 1825 may together function also as the component moving module. In such examples, actuator 1825 may move substrate holder 1815 to tilt the substrate to cause the force of gravity to pull component 1805 towards alignment member 1820, as described for example in relation to FIGS. 15A-D. Moreover, in some examples actuator 1825 may also mechanically agitate or vibrate substrate holder 1815, and thereby substrate 1810, to facilitate the movement of component 1805 on substrate 1810. Furthermore, in some examples the component moving module may also comprise a gas blowing module (not shown) to blow a gas across the surface of substrate 1810 to facilitate movement of component 1805 on substrate 1810. It is contemplated that in some examples the tilting or the mechanical agitation mechanisms may be separate from actuator 1825.

In addition, in some examples the component moving module may be a part of or be incorporated into alignment member 1820. For example, alignment member 1820 may comprise a permanent magnet, which may then exert an attractive magnetic force on component 1805 when the alignment member is extended through the opening in substrate 1810. Moreover, in some examples the component moving module may comprise a separate permanent magnet coupled to alignment member 1820.

Furthermore, in some examples the component moving module may comprise an electromagnet. In some examples, this electromagnet may be formed by placing windings around alignment member 1820, or by otherwise electrifying alignment member 1820. Moreover, in some examples the electromagnet may be separate from and coupled to alignment member 1820.

In some examples, the component moving module may comprise a liquid dispenser (not shown) to dispense quantities of liquid on substrate 1810. As the liquid quantities wet component 1805, the surface tension force of the liquid may move component 1805 towards alignment member 1820, as described herein in relation to FIG. 17.

System 1800 may also comprise a component securing module 1845, which may be used to secure component 1805 to substrate 1810 after component 1805 is aligned relative to substrate 1810 and before alignment member 1820 is retracted from the opening in substrate 1810. In some examples, component securing module 1845 may comprise an energy source to heat and melt solid solder disposed between component 1805 and substrate 1810. For example, such an energy source may comprise a laser, a radiative heater or heat lamp, an ultrasound emitter, a furnace, and the like.

In some examples, the component securing module may comprise an applicator for applying solder, an adhesive, an overcoating layer, and the like, to secure component 1805 to substrate 1810. Moreover, in FIGS. 18A and 18B, component securing module 1845 is shown as being in communication with actuator 1825 via a link 1850. It is contemplated that in some examples component securing module 1845 need not be in communication with actuator 1825.

FIG. 18B shows a further configuration in which alignment member 1820 extends through an opening in substrate 1810. Actuator 1825 may move substrate holder 1815 or alignment member 1820 relative to one another between the configuration shown in FIG. 18A and the configuration shown in FIG. 18B.

In some examples, system 1800 may perform method 100 and the other methods described herein. In addition, in some examples system 1800 may comprise alignment members or jigs, or work with substrates, as described herein in relation to FIGS. 1-17. It is also contemplated that in some examples system 1800 may perform methods or functions other than those described in relation to FIGS. 1-17. Moreover, it is contemplated that method 100 and the other methods described herein may be performed using system 1800 and the other systems described herein, or using other systems different than the systems described herein.

In addition, in some examples the methods and systems described herein may be used to improve the accuracy of the positioning or alignment of a component on a substrate. For example, in Tape and Reel manufacturing methods, the accuracy of the positioning of a component on a substrate may be about ±100 µm. In some examples, the alignment members described herein may be positioned relative to the substrate with an accuracy of about ±10 µm. As described herein, these alignment members may in turn be used to align the components on the substrate, also to an accuracy of about ±10 µm.

Throughout this specification and the appended claims, infinitive verb forms are often used. Examples include, without limitation: "to align," "to form," "to cause," "to attract," and the like. Unless the specific context requires otherwise, such infinitive verb forms are used in an open, inclusive sense, that is as "to, at least, align," to, at least, form," "to, at least, cause," and so on.

The above description of illustrated example implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. Moreover, the various example implementations described herein may be combined to provide further implementations.

In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A method comprising:
   placing a component on a substrate;
   extending an alignment member through an opening in the substrate;
   extending an additional alignment member through one of the opening or an additional opening in the substrate;
   moving the component while on the substrate to abut against the alignment member and the additional alignment member to align the component along two linearly-independent directions on the substrate;

securing the component to the substrate; and retracting the alignment member and the additional alignment member.

2. The method of claim 1, wherein after moving the component to abut against the alignment member, the alignment member contacts two sides of the component to align the component along two linearly-independent directions on the substrate.

3. The method of claim 1, wherein after moving the component, the alignment member abuts against a first side of the component and the additional alignment member abuts against a second side of the component.

4. The method of claim 1, wherein:

the alignment member is secured to a support to form a jig; and extending and the retracting the alignment member comprises moving one or both of the jig and the substrate closer to and further from one another respectively.

5. The method of claim 1, wherein moving the component comprises exerting a magnetic force between the alignment member and the component to attract the component towards the alignment member.

6. The method of claim 5, wherein:

the alignment member comprises an electromagnet; and exerting the magnetic force comprises electrifying the electromagnet.

7. The method of claim 5, wherein extending the alignment member comprises:

extending the alignment member comprising a permanent magnet through the opening in the substrate.

8. The method of claim 1, further comprising:

providing a quantity of a liquid disposed on the substrate between the substrate and the component; and wherein:

moving the component comprises applying a surface tension force of the liquid to the component.

9. The method of claim 8, wherein providing the quantity of the liquid comprises providing a plurality of sub-quantities of the liquid spaced from one another.

10. The method of claim 8, wherein providing the liquid comprises:

providing a solid solder disposed on the substrate between the substrate and the component; and melting the solid solder.

11. The method of claim 1, wherein moving the component comprises tilting the substrate to cause gravity to pull the component towards the alignment member.

12. The method of claim 11, wherein moving the component further comprises vibrating the substrate and the component.

13. The method of claim 11, wherein moving the component further comprises blowing a gas across a surface of the substrate to push the component towards the alignment member.

14. The method of claim 1, wherein securing the component to the substrate comprises soldering the component to the substrate.

15. The method of claim 1, wherein extending the alignment member comprises:

extending the alignment member comprising a solder non-adhesive material through the opening in the substrate.

16. A method comprising:

placing a component on a substrate;

extending an alignment member through an opening in the substrate;

extending an additional alignment member through an additional opening in the substrate;

moving the component to abut against the alignment member and the additional alignment member to align the component along two linearly-independent directions on the substrate;

securing the component to the substrate;

retracting the alignment member through the opening; and retracting the additional alignment member through the additional opening.

* * * * *